United States Patent
Kida et al.

(10) Patent No.: US 10,600,716 B2
(45) Date of Patent: Mar. 24, 2020

(54) POWER CONVERTER

(71) Applicant: TOYOTA JIDOSHA KABUSHIKI KAISHA, Toyota-shi, Aichi-ken (JP)

(72) Inventors: Yoshihiro Kida, Nishio (JP); Kaoru Torii, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/970,066

(22) Filed: May 3, 2018

(65) Prior Publication Data

US 2018/0337107 A1    Nov. 22, 2018

(30) Foreign Application Priority Data

May 17, 2017    (JP) ................ 2017-098130

(51) Int. Cl.
*H01L 23/367* (2006.01)
*H01L 23/00* (2006.01)
(Continued)

(52) U.S. Cl.
CPC .......... *H01L 23/3677* (2013.01); *H01L 23/36* (2013.01); *H01L 23/3735* (2013.01);
(Continued)

(58) Field of Classification Search
CPC ... H01L 23/3677; H01L 23/36; H01L 25/115; H01L 25/072; H01L 23/473; H01L 23/3735; H01L 24/42; H01L 25/18; H01L 2224/49175; H01L 2224/48091; H01L 2924/1305; H02M 7/003; H02M 1/08;
(Continued)

(56) References Cited

U.S. PATENT DOCUMENTS 8,654,554 B2 * 2/2014 Seki ................ H01L 24/32
361/688
8,754,511 B2 * 6/2014 Atsumi .............. H01L 24/33
257/675

(Continued)

FOREIGN PATENT DOCUMENTS

JP    2008166333 A    7/2008
JP    2008-294216 A    12/2008
JP    2013034304 A    2/2013

*Primary Examiner* — Jayprakash N Gandhi
*Assistant Examiner* — Stephen S Sul
(74) *Attorney, Agent, or Firm* — Sughrue Mion, PLLC (57) ABSTRACT

A power converter includes: two switching elements; a positive electrode conductive plate: a negative electrode conductive plate; a mid-point conductive plate; a first heat sink; and a second heat sink. The positive electrode conductive plate is connected to a high-potential terminal of a series connection of the two switching elements, and the negative electrode conductive plate is connected to a low-potential terminal of the series connection. The mid-point conductive plate is connected to a middle point of the series connection. The first heat sink faces the positive electrode conductive plate and the negative electrode conductive plate with a first isolating layer interposed therebetween, and is connected to a ground terminal. The second heat sink faces the mid-point conductive plate with a second isolating layer interposed therebetween, and is isolated from the ground terminal.

4 Claims, 4 Drawing Sheets

(51) Int. Cl.
*H02M 1/08* (2006.01)
*H02M 7/48* (2007.01)
*H05K 7/20* (2006.01)
*H01L 23/36* (2006.01)
*H01L 25/07* (2006.01)
*H02M 7/00* (2006.01)
*H01L 25/11* (2006.01)
*H01L 23/373* (2006.01)
*H01L 23/473* (2006.01)
*H01L 25/18* (2006.01)

(52) U.S. Cl.
CPC ............ *H01L 23/473* (2013.01); *H01L 24/42* (2013.01); *H01L 25/072* (2013.01); *H01L 25/115* (2013.01); *H02M 1/08* (2013.01); *H02M 7/003* (2013.01); *H02M 7/48* (2013.01); *H05K 7/20909* (2013.01); *H01L 25/18* (2013.01); *H01L 2224/48091* (2013.01); *H01L 2224/49175* (2013.01); *H01L 2924/00014* (2013.01); *H01L 2924/1305* (2013.01); *H01L 2924/13055* (2013.01); *H01L 2924/13091* (2013.01)

(58) Field of Classification Search
CPC . H02M 7/48; H05K 7/20909; H05K 7/20418; H05K 7/209
USPC .......................................... 361/707, 709, 713
See application file for complete search history.

(56) References Cited

U.S. PATENT DOCUMENTS

| | | | | |
|---|---|---|---|---|
| 9,960,096 | B2* | 5/2018 | Okumura | H01L 25/07 |
| 2004/0021220 | A1 | 2/2004 | Kubo | |
| 2005/0056927 | A1* | 3/2005 | Teshima | H01L 23/4334 257/712 |
| 2012/0001308 | A1* | 1/2012 | Fukutani | H01L 23/49524 257/675 |
| 2012/0112366 | A1 | 5/2012 | Crebier | |
| 2013/0016548 | A1* | 1/2013 | Seki | H01L 24/32 363/131 |
| 2014/0159216 | A1* | 6/2014 | Ishino | H01L 23/4006 257/675 |
| 2016/0336251 | A1* | 11/2016 | Fukuoka | H01L 29/7395 |
| 2016/0343630 | A1* | 11/2016 | Kadoguchi | H01L 23/051 |
| 2017/0309540 | A1* | 10/2017 | Temmei | H01L 23/62 |
| 2019/0006255 | A1* | 1/2019 | Suwa | H01L 23/28 |

* cited by examiner

POWER CONVERTER

INCORPORATION BY REFERENCE

The disclosure of Japanese Patent Application No. 2017-098130 filed on May 17, 2017 including the specification, drawings and abstract is incorporated herein by reference in its entirety.

BACKGROUND

1. Technical Field

The present specification discloses a power converter. In particular, the present specification discloses a power converter including heat sinks to cool a series connection of two switching elements and these switching elements.

2. Description of Related Art

Most of power converters such as bi-directional DC-DC converters and inverters include series connections each of which includes two switching elements. For example, a three-phase AC inverter is provided with a circuit including three sets of series connections connected in parallel, each set including two switching elements. Examples of switching elements may typically include transistors, such as insulated gate bipolar transistors (IGBTs), and metal oxide semiconductor field effect transistors (MOSFETs).

Noise is generated due to ON-OFF operation of switching elements. Voltage fluctuations due to the ON-OFF operation become greater at a middle point of a series connection than at a high-potential terminal and a low-potential terminal thereof. Noise generated due to voltage conversion at the middle point of the series connection may influence other devices.

Common-mode noise is derived from noise generated due to voltage fluctuations at the middle point, propagating through a ground terminal of a system including a power converter, and then returning to the switching elements; and if a propagation path of the common-mode noise is long, the common-mode noise becomes radiation noise, and influences other devices. For convenience of explanation, hereinafter, the expression "common-mode noise" is used for representing noise generated due to voltage fluctuations at the middle point of the series connection, and propagating via the ground.

In the meantime, since switching elements of power converters give off a great deal of heat, many power converters include heat sinks. Conductive plates connected to switching elements have excellent thermal conductivity, and thus the heat sink may be disposed to face conductive plates with an isolating layer interposed therebetween. A material having high thermal conductivity such as copper is used for a heat sink, and such a material is often an electrically conductive material. Hence, the heat sink and the conductive plates disposed with an isolating layer interposed therebetween compose capacitors. Such capacitors are called stray capacitances. By connecting the electric conductive heat sink to the ground terminal, common-mode noise can propagate through a casing of the power converter and the above stray capacitances to return to the switching elements. As a result, the path of the common-mode noise becomes smaller, to thus reduce radiation noise.

Japanese Patent Application Publication No. 2008-294216 further discloses a technique of reducing the common-mode noise. The technique is as follows. Three conductive plates (copper patterns) face a heat sink (a cooling plate) made of copper with an isolating plate interposed therebetween. The heat sink is connected to a ground terminal. A high-potential terminal of a series connection of two switching elements is connected to a first conductive plate, and a low-potential terminal of the series connection is connected to a second conductive plate. A middle point of the series connection is connected to a third conductive plate. The isolating layer has a larger thickness only at a position corresponding to the third conductive plate. Hence, a stray capacitance between the third conductive plate and the heat sink, that is, a stray capacitance between the middle point and the ground becomes smaller. As a result, the common-mode noise transmitted to the ground terminal is suppressed.

SUMMARY

In the power converter in JP 2008-294216 A, a distance between the third conductive plate and the heat sink becomes great and the cooling performance is sacrificed. In the present specification, provided is a technique to reduce common-mode noise without sacrificing the cooling performance, compared with the technique of JP 2008-294216 A.

An aspect of the present disclosure provides a power converter that includes two switching elements connected in series, a positive electrode conductive plate, a negative electrode conductive plate, a mid-point conductive plate, a first heat sink, and a second heat sink. The positive electrode conductive plate is connected to a high-potential terminal of a series connection of the two switching elements. The negative electrode conductive plate is connected to a low-potential terminal of the series connection of the two switching elements. The mid-point conductive plate is connected to a middle point of the series connection of the two switching elements. The first heat sink has electric conductivity. The first heat sink faces the positive electrode conductive plate with a first isolating layer interposed between the first heat sink and the positive electrode conductive plate. The first heat sink faces the negative electrode conductive plate with the first isolating layer interposed between the first heat sink and the negative electrode conductive plate. The first heat sink is connected to a ground terminal maintained at a ground potential. The second heat sink has electric conductivity. The second heat sink faces the mid-point conductive plate with a second isolating layer interposed between the second heat sink and the mid-point conductive plate. The second heat sink is isolated from the ground terminal. In the power converter, the second heat sink facing the mid-point conductive plate is isolated from the ground terminal, to thereby reduce common-mode noise propagating from the mid-point conductive plate to the ground terminal. Hence, it is unnecessary to increase the thickness of the second isolating layer disposed between the mid-point conductive plate and the second heat sink, and thus the cooling performance is suppressed from being greatly deteriorated. Here, the first isolating layer and the second isolating layer may be a common single isolating layer.

In the above power converter, the first heat sink and the second heat sink may be coupled to each other with an isolating member interposed between the first heat sink and the second heat sink. At this time, a stray capacitance is generated between the first heat sink and the second heat sink with the isolating member interposed therebetween. In the meantime, a stray capacitance is also generated between the mid-point conductive plate and the second heat sink with the second isolating layer interposed therebetween. A stray capacitance is also generated between the positive electrode conductive plate and the first heat sink with the first isolating layer interposed therebetween, and a stray capacitance is also generated between the negative electrode conductive plate and the first heat sink with the first isolating layer interposed therebetween. Noise generated from the midpoint conductive plate propagates through the second heat sink, the first heat sink, and the positive electrode conductive plate (or the negative electrode conductive plate), and then returns to the switching elements. During this, the noise propagates through three stray capacitances, and the noise is thereby attenuated.

In the above power converter, a refrigerant flow passage may be disposed between the first heat sink and the second heat sink.

In the above power converter, the first heat sink may be disposed so as to surround the two switching elements; the first isolating layer; the positive electrode conductive plate; the negative electrode conductive plate; the mid-point conductive plate; the second isolating layer; the second heat sink; and an isolating member. The second heat sink may face the first heat sink with the isolating member interposed between the second heat sink and the first heat sink.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

First Embodiment

Figure 1:
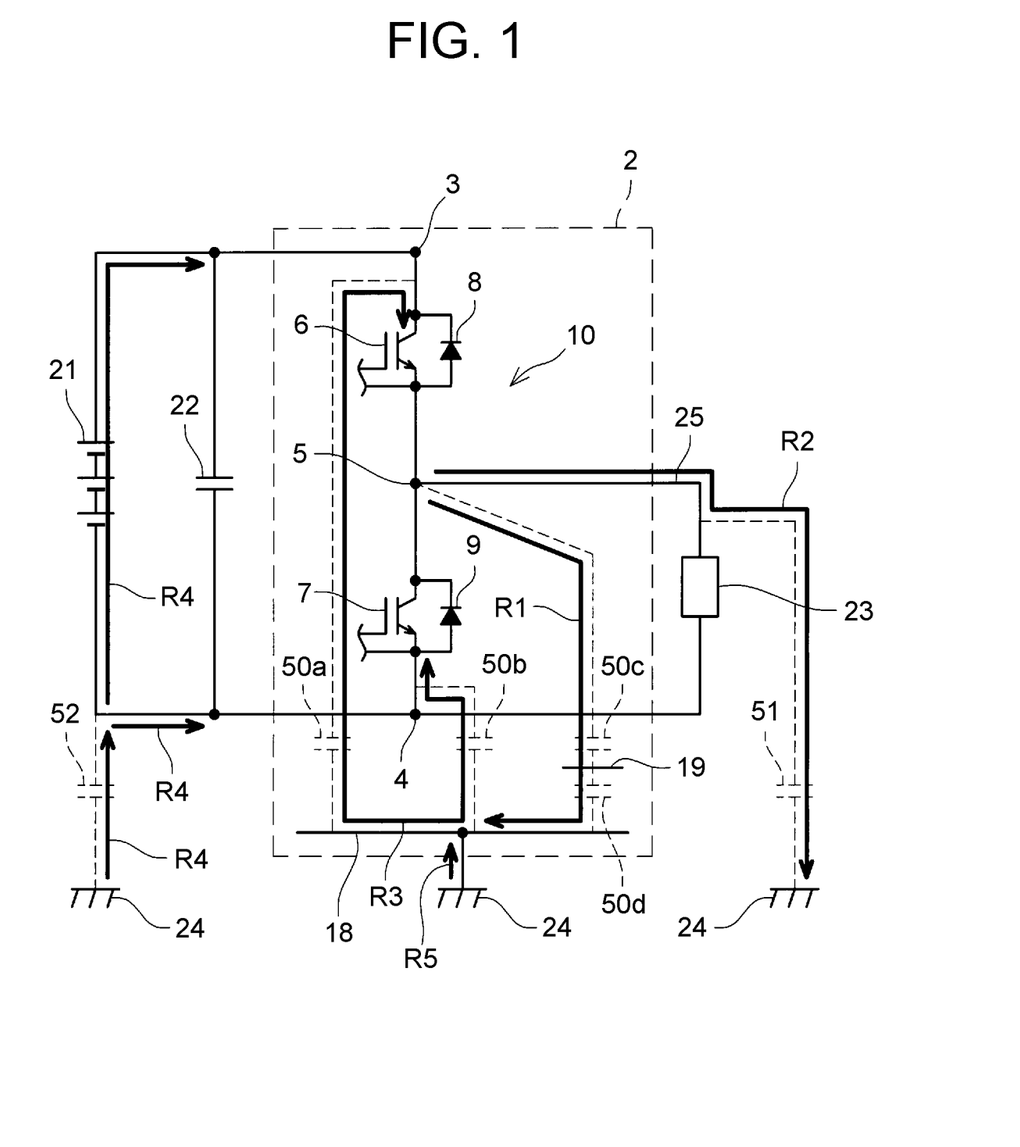
FIG. 1 is an equivalent circuit diagram of a power converter of a first embodiment.
Figure 2:
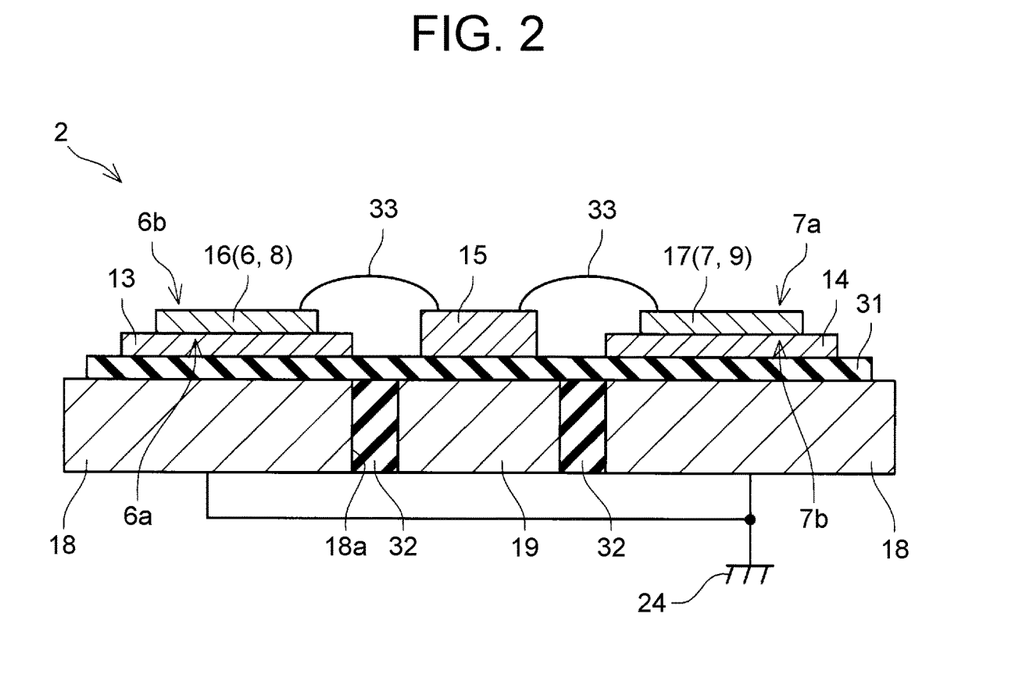
FIG. 2 is a sectional view of a power converter of the first embodiment.

With reference to FIG. 1 and FIG. 2, a power converter of the first embodiment will be described. FIG. 1 is an equivalent circuit diagram of a power converter 2 including peripheral devices. FIG. 2 is a sectional view of the power converter 2. The power converter 2 is an inverter that converts direct current (DC) electric power into alternating current (AC) electric power. The power converter 2 outputs a three-phase alternating current, but FIG. 1 and FIG. 2 show only a structure (circuit) for an alternating current by one phase, and illustrations of structures (circuits) for alternating currents by the other two phases are omitted. Each of the structures for the alternating currents by the other two phases has the same structure as the structure (circuit) for alternating current by the one phase shown in FIG. 1 and FIG. 2.

Description will be started with an equivalent circuit of the power converter 2 with reference to FIG. 1. The power converter 2 includes two switching elements 6, 7 and two freewheeling diodes 8, 9. The switching elements 6, 7 are, for example, insulated gate bipolar transistors (IGBTs). The two switching elements 6, 7 are connected in series. The freewheeling diode 8 is connected in anti-parallel with the switching element 6, and the freewheeling diode 9 is connected in anti-parallel with the switching element 7. A DC power source 21 is connected to a high-potential terminal 3 and to a low-potential terminal 4 of a series connection 10 of the two switching elements 6, 7. A smoothing capacitor 22 is connected in parallel with the high-potential terminal 3 and with the low-potential terminal 4. A load 23 is connected to a middle point 5 of the series connection 10 of the two switching elements 6, 7 and to the low-potential terminal 4. The load 23 is a device, such as an electric motor, operating by AC electric power. A cable connecting the load 23 to the middle point 5 is referred to as an output cable 25.

An alternating current is output from the middle point 5 through an appropriate ON-OFF operation of the switching elements 6, 7. The power converter 2 further includes two more sets of the series connections, each having the same structure as that of the series connection 10 of the switching elements 6, 7, and these sets are connected in parallel with the DC power source 21, but illustrations thereof are omitted. An alternating current is outputted from the respective middle points of the three sets of series connections in total. The three types of alternating currents respectively outputted from the three sets of series connections have phases displaced from one another by 120°, and these alternating currents are supplied to the load 23 as a three-phase alternating current.

Reference numerals 24 in FIG. 1 indicate ground terminals. Capacitors 50a, 50b, 50c, 50d illustrated by broken lines indicate stray capacitances generated in the power converter 2. A capacitor 51 illustrated by broken lines represents a stray capacitance generated between the load 23 and the ground terminal 24, and a capacitor 52 indicates a stray capacitance generated between the DC power source and the ground terminal 24. Hereinafter, the capacitors 50a to 50d, 51, 52 are referred to as stray capacitances 50a to 50d, 51, 52, respectively. A stray capacitance is a capacitive component generated due to a physical structure of electronic equipment (an electronic component), and is a capacitive component unintended by a circuit designer. The stray capacitance is also called a parasitic capacitance.

Reference numerals 18 and 19 in FIG. 1 represent heat sinks that dissipate heat of semiconductor chips accommodating the switching elements 6, 7 and the freewheeling diodes 8, 9 therein. Next, with reference to FIG. 2, a physical structure of the power converter 2 including the heat sinks (a first heat sink 18, a second heat sink 19), and the above-described capacitors 50a to 50d will be described. The switching element 6 and the freewheeling diode 8 in the equivalent circuit diagram (FIG. 1) are incorporated in a semiconductor chip 16. Inside the semiconductor chip 16, the switching element 6 and the freewheeling diode 8 are connected in anti-parallel with each other. The semiconductor chip 16 is of a flat type, a collector electrode 6a of the switching element 6 is provided on one surface (a bottom surface in FIG. 2) of the semiconductor chip 16, and an emitter electrode 6b of the switching element 6 is provided on the other surface (a top surface in FIG. 2) of the semiconductor chip 16. The switching element 7 and the freewheeling diode 9 in the equivalent circuit diagram (FIG. 1) are incorporated in a semiconductor chip 17. Inside the semiconductor chip 17, the switching element 7 and the freewheeling diode 9 are connected in anti-parallel with each other. The semiconductor chip 17 is of a flat type, a collector electrode 7a of the switching element 7 is provided on one surface (a top surface in FIG. 2) of the semiconductor chip 17, and an emitter electrode 7b of the switching element 7 is provided on the other surface (a bottom surface in FIG. 2) of the semiconductor chip 17. In FIG. 2, illustrations of internal structures of the semiconductor chips 16, 17 are omitted, and they are simply hatched.

A positive electrode conductive plate 13 is joined to the bottom surface of the semiconductor chip 16 where the collector electrode 6a thereof is exposed. The collector electrode 6a and the positive electrode conductive plate 13 are electrically connected to each other. A negative electrode conductive plate 14 is joined to the bottom surface of the semiconductor chip 17 where the emitter electrode 7b is exposed. The emitter electrode 7b and the negative electrode conductive plate 14 are electrically connected to each other. The positive electrode conductive plate 13 and the negative electrode conductive plate 14 are supported by the first heat sink 18 with an isolating layer 31 interposed therebetween. In other words, the positive electrode conductive plate 13 and the negative electrode conductive plate 14 face the first heat sink 18 with the isolating layer 31 interposed therebetween.

The first heat sink 18 is provided with a through-hole 18a. An isolating member 32 is provided on an inner circumference of the through-hole 18a, and the second heat sink 19 is disposed inward of the isolating member 32. The second heat sink 19 is isolated from the first heat sink 18. A mid-point conductive plate 15 is supported by the second heat sink 19 with the isolating layer 31 interposed therebetween. In other words, the mid-point conductive plate 15 faces the second heat sink 19 with the isolating layer 31 interposed therebetween. The emitter electrode 6b of the semiconductor chip 16 and the collector electrode 7a of the semiconductor chip 17 are electrically connected to the mid-point conductive plate 15 via wire harnesses 33.

The mid-point conductive plate 15 is one example of the middle point 5 of the series connection of the two semiconductor chips 16, 17 (the two switching elements 6, 7). The positive electrode conductive plate 13 connected to the collector electrode 6a of the semiconductor chip 16 (the switching element 6) is one example of the high-potential terminal 3 of the series connection. The negative electrode conductive plate 14 connected to the emitter electrode 7b of the semiconductor chip 17 (the switching element 7) is one example of the low-potential terminal 4 of the series connection (see FIG. 1).

Although a cable extending from the DC power source 21 (see FIG. 1) is connected to the positive electrode conductive plate 13 and to the negative electrode conductive plate 14, an illustration thereof is omitted. Although another cable extending from the load 23 (see FIG. 1) is connected to the mid-point conductive plate 15 and to the negative electrode conductive plate 14, an illustration of the cable is also omitted.

The first heat sink 18 and the second heat sink 19 are made of copper, so that these heat sinks have excellent thermal conductivity, and also have electric conductivity. The first heat sink 18 is electrically connected to the ground terminal 24. The second heat sink 19 is isolated from the first heat sink 18, and thus the second heat sink 19 is also isolated from the ground terminal 24.

The positive electrode conductive plate 13 joined to the collector electrode 6a of the semiconductor chip 16 faces the first heat sink 18 with the isolating layer 31 interposed therebetween. The first heat sink 18 is connected to the ground terminal 24. The positive electrode conductive plate 13 and the first heat sink 18 facing each other with the isolating layer 31 interposed therebetween compose the stray capacitance 50a shown in FIG. 1. The negative electrode conductive plate 14 joined to the emitter electrode 7b of the semiconductor chip 17 faces the first heat sink 18 with the isolating layer 31 interposed therebetween. The negative electrode conductive plate 14 and the first heat sink 18 facing each other with the isolating layer 31 interposed therebetween compose the stray capacitance 50b shown in FIG. 1. The mid-point conductive plate 15 corresponding to the middle point of the series connection of the two semiconductor chips 16, 17 (the two switching elements 6, 7) faces the second heat sink 19 with the isolating layer 31 interposed therebetween. The mid-point conductive plate 15 and the second heat sink 19 facing each other with the isolating layer 31 interposed therebetween compose the stray capacitance 50c shown in FIG. 1. An inner circumferential surface of the through-hole 18a provided in the first heat sink 18 and an outer circumferential surface of the second heat sink 19 face each other with the isolating member 32 interposed therebetween. The first heat sink 18 and the second heat sink 19 facing each other with the isolating member 32 interposed therebetween compose the stray capacitance 50d shown in FIG. 1.

The stray capacitance 51 shown in FIG. 1 is present between the load 23 and the ground terminal 24. The stray capacitance 51 is generated, for example, between a casing (a casing of the load 23) connected to the ground terminal 24 and an electric component of the load 23 located close to the casing. The stray capacitance 52 shown in FIG. 1 is present between the DC power source 21 and the ground terminal 24. The stray capacitance 52 is generated, for example, between a casing (a casing of the DC power source 21) connected to the ground terminal 24 and an electric component of the DC power source 21 located close to the casing.

With reference to FIG. 1 again, transmission pathways of common-mode noise will be described. As aforementioned, in the present specification, the common-mode noise denotes noise generated due to voltage fluctuations at the middle point of the series connection of the two switching elements, and propagating via the ground terminal. As routes of the common-mode noise coming from the middle point 5, there are a route via the stray capacitances 50c, 50d and a route via the stray capacitance 51. Physically, the former route is a route via the mid-point conductive plate 15, the isolating layer 31, the second heat sink 19, the isolating member 32, and the first heat sink 18 (a route R1 in FIG. 1). Physically, the latter route is a route via the output cable 25 and the load 23 (a route R2 in FIG. 1). The route via the stray capacitances 50c, 50d further passes via the stray capacitance 50a or the stray capacitance 50b (the first heat sink 18 and the positive electrode conductive plate 13 or the negative electrode conductive plate 14), and then returns to the switching elements 6, 7 (a route R3 in FIG. 1). In the above routes (R1 and R3), the first heat sink 18 and the second heat sink 19 are coupled to each other via the isolating member 32, and the routes thereby pass via the three stray capacitances 50a to 50d (the route via the stray capacitances 50a, 50c, 50d or the route via the stray capacitances 50b, 50c, 50d). By propagating through many stray capacitances, the common-mode noise is attenuated (the common-mode noise is reduced). The routes passing through the routes R1, R3, and then returning to the switching elements 6, 7 do not pass through the ground terminal 24 itself, but passes through the first heat sink 18 having an equal potential to that of the ground terminal 24, and thus the noise propagating through the route is treated as the common-mode noise.

In the meantime, the common-mode noise propagating via the stray capacitance 51 mainly propagates via the stray capacitances 50a, 50b rather than via the stray capacitance 52 (a route R4 of FIG. 1), and then returns to the switching elements 6, 7 (routes R3, R5 in FIG. 1). This is because a distance of a ground wire between the load 23 (the motor) and the power converter 2 is generally shorter than a distance of a ground wire between the load 23 (the motor) and the DC power source 21. The common-mode noise propagating via the routes R5, R3 is increased, and the common-mode noise propagating via the stray capacitance 52 located close to the DC power source 21 is reduced by that increase. Through this, it is possible to increase a percentage of the common-mode noise returning in a smaller loop, thus to reduce radiation noise.

As described above, the power converter 2 of the present embodiment can suppress the common-mode noise. On the other hand, in the power converter 2, it is unnecessary to increase a thickness of the isolating layer 31 between the mid-point conductive plate 15 and the second heat sink 19, thus sacrificing no cooling performance.

Second Embodiment

Figure 3:
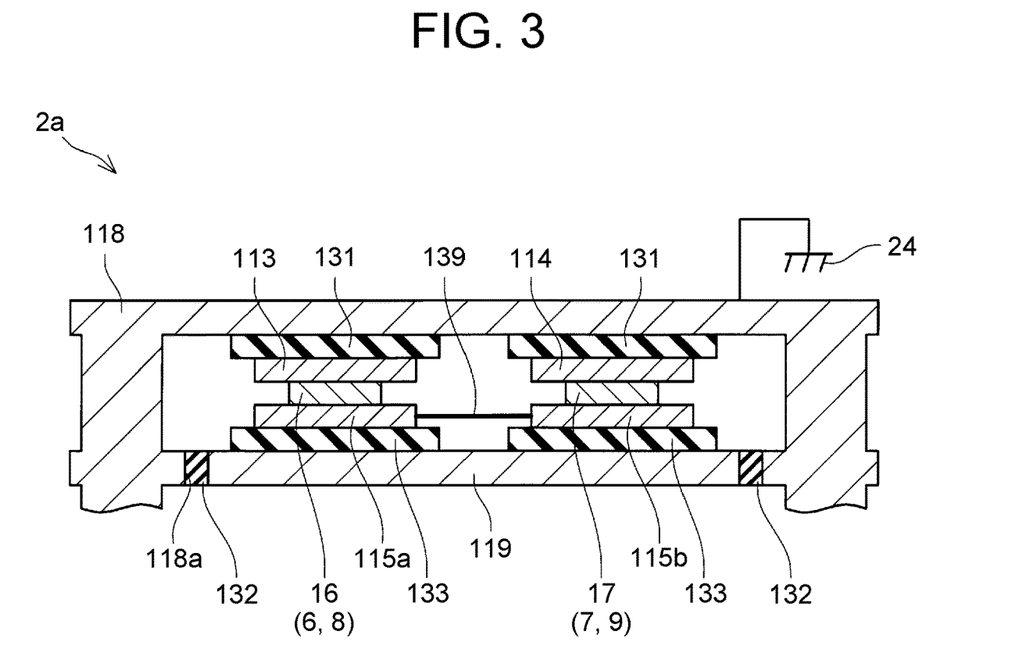
FIG. 3 is a sectional view of a power converter of a second embodiment.

With reference to FIG. 3, a power converter 2a of the second embodiment will be described. FIG. 3 is a sectional view of the power converter 2a of the second embodiment. As with the first embodiment, the switching element 6 and the freewheeling diode 8 are incorporated in the semiconductor chip 16, and they are connected in anti-parallel with each other. The switching element 7 and the freewheeling diode 9 are incorporated in the semiconductor chip 17, and they are connected in anti-parallel with each other. A collector electrode of the switching element 6 is provided on the top surface of the semiconductor chip 16, and an emitter electrode of the switching element 6 is provided on the bottom surface of the semiconductor chip 16. An emitter electrode is provided on the top surface of the semiconductor chip 17, and a collector electrode is provided on the bottom surface of the semiconductor chip 17.

A positive electrode conductive plate 113 is joined to the top surface of the semiconductor chip 16 where the collector electrode is exposed. The collector electrode of the semiconductor chip 16 (the switching element 6) and the positive electrode conductive plate 113 are electrically connected to each other. A negative electrode conductive plate 114 is joined to the top surface of the semiconductor chip 17 where the emitter electrode is exposed. The emitter electrode of the semiconductor chip 17 (the switching element 7) and the negative electrode conductive plate 114 are electrically connected to each other. The positive electrode conductive plate 113 and the negative electrode conductive plate 114 are supported by a first heat sink 118 with first isolating layers 131 interposed therebetween. In other words, the positive electrode conductive plate 113 and the negative electrode conductive plate 114 face the first heat sink 118 with the first isolating layers 131 interposed therebetween.

The first heat sink 118 extends around the semiconductor chips 16, 17 to the opposite sides of the semiconductor chips 16, 17, and includes an aperture 118a. An isolating member 132 is provided on an inner circumference of the aperture 118a, and a second heat sink 119 is disposed inward of the isolating member 132. The second heat sink 119 is isolated from the first heat sink 118. The first heat sink 118 and the second heat sink 119 compose a container accommodating the semiconductor chips 16, 17, the positive electrode conductive plate 113, the negative electrode conductive plate 114, and first and second mid-point conductive plates 115a, 115b described later. A space surrounded by the first heat sink 118 and the second heat sink 119 is charged with not-illustrated resin. That is, the semiconductor chips 16, 17, the positive electrode conductive plate 113, the negative electrode conductive plate 114, and the first and second mid-point conductive plates 115a, 115b described later are sealed by the resin.

The first mid-point conductive plate 115a is joined to the bottom surface of the semiconductor chip 16 where the emitter electrode is exposed. The emitter electrode of the semiconductor chip 16 and the first mid-point conductive plate 115a are electrically connected to each other. The second mid-point conductive plate 115b is joined to the bottom surface of the semiconductor chip 17 where the collector electrode is exposed. The collector electrode of the semiconductor chip 17 and the second mid-point conductive plate 115b are electrically connected to each other.

The first mid-point conductive plate 115a and the second mid-point conductive plate 115b are supported by the second heat sink 119 with second isolating layers 133 interposed therebetween. In other words, the first mid-point conductive plate 115a and the second mid-point conductive plate 115b face the second heat sink 119 with the second isolating layers 133 interposed therebetween. The first mid-point conductive plate 115a and the second mid-point conductive plate 115b are connected to each other via a wire harness 139.

The first mid-point conductive plate 115a and the second mid-point conductive plate 115b have an equal potential, and corresponds to the middle point 5 (see FIG. 1) of the series connection of the two semiconductor chips 16, 17 (the two switching elements 6, 7). The positive electrode conductive plate 113 connected to the collector electrode of the semiconductor chip 16 (the switching element 6) corresponds to the high-potential terminal 3 (see FIG. 1) of the series connection, and the negative electrode conductive plate 114 connected to the emitter electrode of the semiconductor chip 17 (the switching element 7) corresponds to the low-potential terminal 4 (see FIG. 1) of the series connection. Although a cable extending from the DC power source 21 (see FIG. 1) is connected to the positive electrode conductive plate 113 and to the negative electrode conductive plate 114, an illustration thereof is omitted. Although another cable extending from the load 23 (see FIG. 1) is connected to either the first mid-point conductive plate 115a or the second mid-point conductive plate 115b, and to the negative electrode conductive plate 114, an illustration thereof is omitted.

The first heat sink 118 and the second heat sink 119 are made of copper, so that they have excellent thermal conductivity, and also have electric conductivity. The first heat sink 118 is electrically connected to the ground terminal 24. The second heat sink 119 is isolated from the first heat sink 118, and thus the second heat sink 119 is also isolated from the ground terminal 24.

The positive electrode conductive plate 113 joined to the top surface (the collector electrode) of the semiconductor chip 16 faces the first heat sink 118 with the first isolating layers 131 interposed therebetween. The first heat sink 118 is connected to the ground terminal 24. The positive electrode conductive plate 113 and the first heat sink 118 facing each other with the first isolating layers 131 interposed therebetween compose the stray capacitance 50a shown in FIG. 1. The negative electrode conductive plate 114 joined to the top surface (the emitter electrode) of the semiconductor chip 17 faces the first heat sink 118 with the first isolating layers 131 interposed therebetween. The negative electrode conductive plate 114 and the first heat sink 118 facing each other with the first isolating layers 131 interposed therebetween compose the stray capacitance 50b shown in FIG. 1. The first mid-point conductive plate 115a and the second mid-point conductive plate 115*b* face each other with the second isolating layers 133 interposed therebetween. The first and the second mid-point conductive plates 115*a*, 115*b* and the second heat sink 119 facing each other with the second isolating layers 133 interposed therebetween compose the stray capacitance 50*c* shown in FIG. 1. Since parasitic reactance is present in the wire harness 139 that connects the first mid-point conductive plate 115*a* to the second mid-point conductive plate 115*b*, common-mode noise propagating from the semiconductor chip 16 via the first mid-point conductive plate 115*a*, and common-mode noise propagating from the semiconductor chip 17 via the second mid-point conductive plate 115*b* are separately present. However, they are both treated as one herein.

An inner circumferential surface of the aperture 118*a* provided in the first heat sink 118 and an outer circumferential surface of the second heat sink 119 face each other with the isolating member 132 interposed therebetween. The first heat sink 118 and the second heat sink 119 facing each other with the isolating member 132 interposed therebetween compose the stray capacitance 50*d* shown in FIG. 1.

The power converter 2*a* in FIG. 3 also has a circuit structure shown by the equivalent circuit diagram in FIG. 1. Hence, the power converter 2*a* in FIG. 3 also reduces the common-mode noise. The power converter 2*a* is configured such that the heat sinks face the respective both surfaces of the semiconductor chips 16, 17, and thus the power converter 2*a* has excellent cooling performance for the semiconductor chips 16, 17.

Third Embodiment

Figure 4:
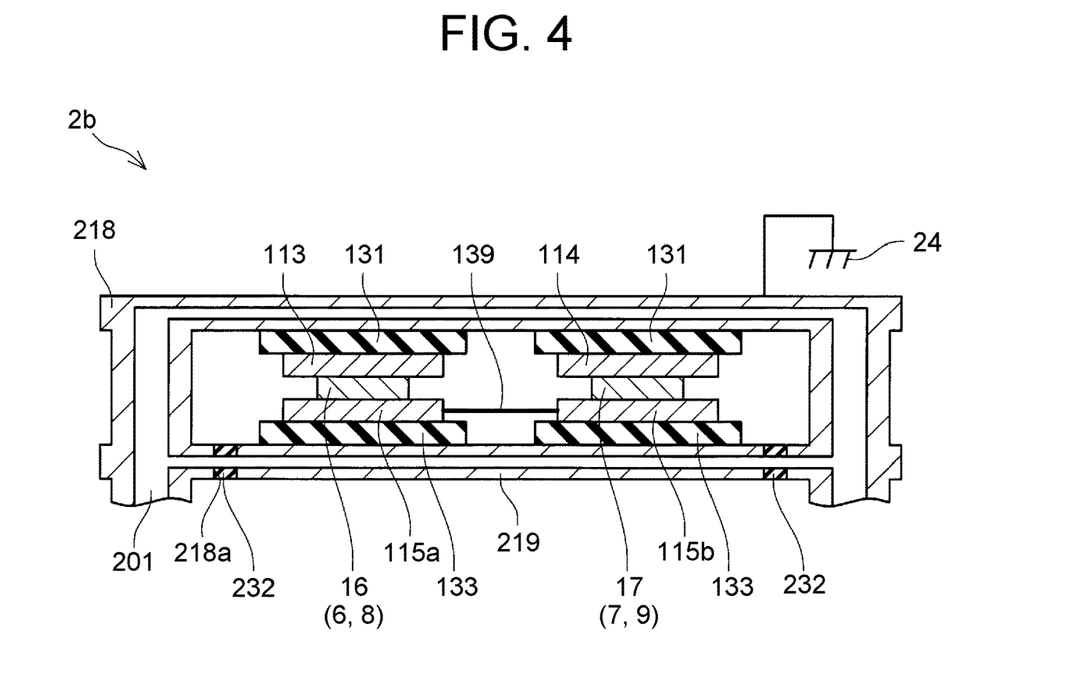
FIG. 4 is a sectional view of a power converter of a third embodiment.

FIG. 4 shows a sectional view of a power converter 2*b* of the third embodiment. In the power converter 2*b*, a refrigerant flow passage 201 through which a liquid refrigerant flows is included inside a first heat sink 218 and a second heat sink 219. The other structures are the same as those of the power converter 2*a* of the second embodiment, and thus description thereof is omitted. Here, in FIG. 4, the same reference numerals are given to the same components as those of the power converter 2*a* in FIG. 3. The power converter 2*b* can attain the same effect as that of the power converter 2*a* of the second embodiment. In addition, the power converter 2*b* includes the refrigerant flow passage 201, and thus the power converter 2*b* has a higher cooling performance of the semiconductor chips 16, 17 than that of the power converter 2*a* of the second embodiment.

Fourth Embodiment

Figure 5:
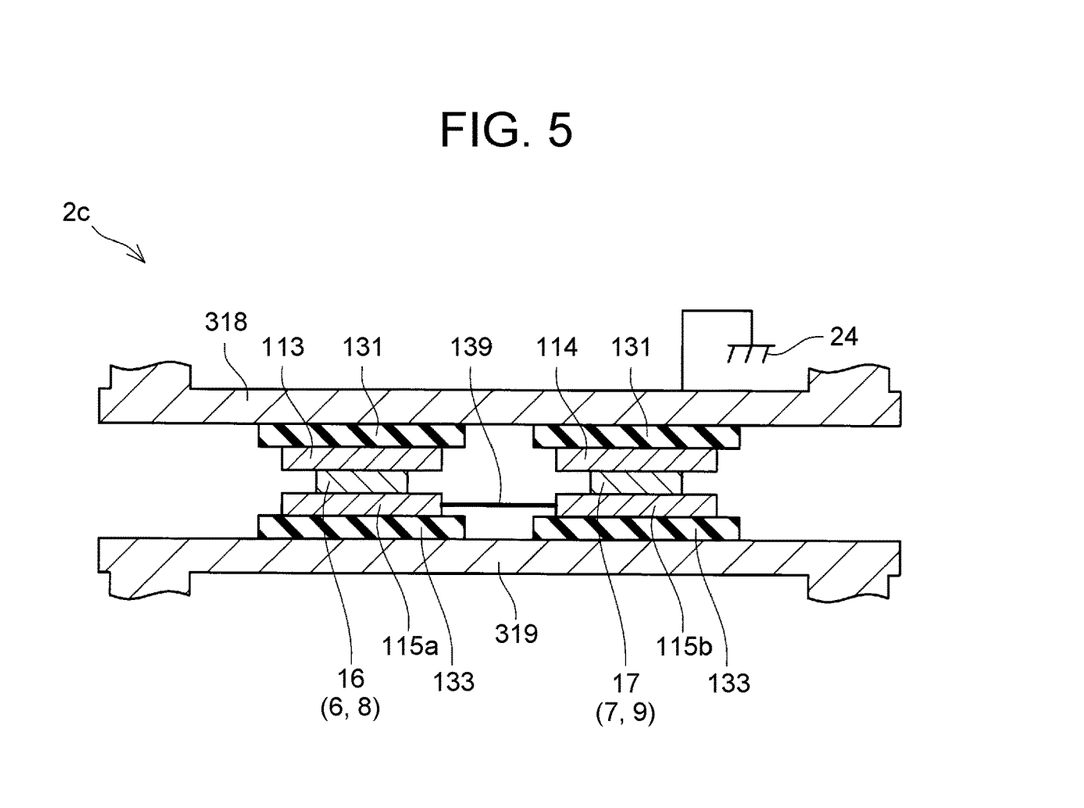
FIG. 5 is a sectional view of a power converter of a fourth embodiment.

FIG. 5 shows a sectional view of a power converter 2*c* of the fourth embodiment. In the power converter 2*c* of the fourth embodiment, a second heat sink 319 is completely apart from a first heat sink 318 connected to the ground terminal 24. The other structures are the same as those of the power converter 2*a* of the second embodiment, and thus description thereof is omitted. In FIG. 5, the same reference numerals are added to the same components as those of the power converter 2*a* in FIG. 3. In the power converter 2*c*, the second heat sink 319 is completely electrically isolated. Hence, no stray capacitance 50*d* in the equivalent circuit diagram in FIG. 1 is present. In this case, all the common-mode noise propagates through the output cable 25 and the load 23 to the ground terminal 24. The common-mode noise having propagated to the ground terminal 24 passes via the stray capacitance 50*a* (the stray capacitance composed of the positive electrode conductive plate 113 and the first heat sink 118), and the stray capacitance 50*b* (the stray capacitance composed of the negative electrode conductive plate 114 and the first heat sink 118), and then returns to the semiconductor chips 16, 17. In this case, the common-mode noise propagating through the DC power source 21 can also be reduced.

Fifth Embodiment

Figure 6:
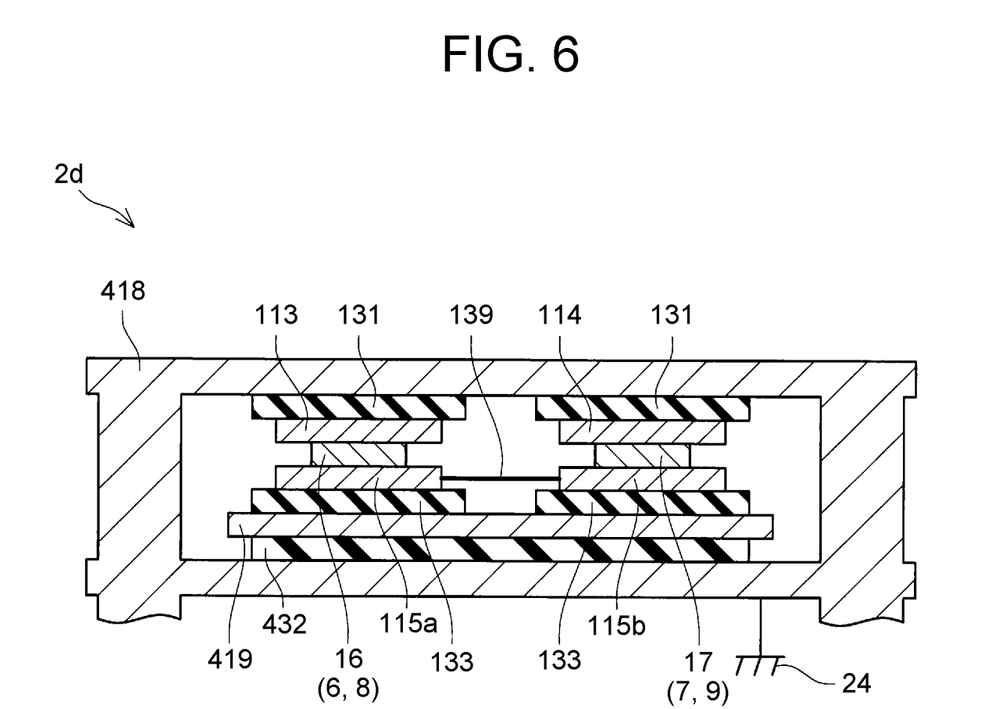
FIG. 6 is a sectional view of a power converter of a fifth embodiment.

FIG. 6 shows a power converter 2*d* of the fifth embodiment. In FIG. 6, the same reference numerals are added to the same components as those of the power converter 2*a* in FIG. 3. In the power converter 2*d*, a first heat sink 418 surrounds the semiconductor chips 16, 17. Furthermore, the first heat sink 418 is so disposed as to surround the semiconductor chips 16, 17, the first isolating layers 131, the positive electrode conductive plate 113, the negative electrode conductive plate 114, the first mid-point conductive plate 115*a*, the second mid-point conductive plate 115*b*, the second isolating layers 133, the second heat sink 419, and an isolating member 432. As shown in FIG. 6, a part of the first heat sink 418 faces the second isolating layers 133. In the power converter 2*d*, the second heat sink 419 and the isolating member 432 are interposed between the second isolating layers 133 and the part of the first heat sink 418 that faces the second isolating layers 133. The second isolating layers 133 are in contact with one surface of the second heat sink 419, and the isolating member 432 is in contact with the other surface of the second heat sink 419. The second heat sink 419 faces a part of the first heat sink 418 with the isolating member 432 interposed therebetween. The power converter 2*d* in FIG. 6 has the same connection relation of the respective components as that of the power converter 2*a* of FIG. 3, and thus the same operational effect as that of the power converter 2*a* can be attained.

Here is one point to note on the technique described in the embodiments. In the power converter of the first embodiment, the isolating layer 31 serves as both the first isolating layer and the second isolating layer in the other embodiments.

Features of the power converters of the above embodiments are summarized as follows. Each of the power converters 2, 2*a* to 2*d* includes the two semiconductor chips 16, 17, the positive electrode conductive plate 13 (113), the negative electrode conductive plate 14 (114), the mid-point conductive plate 15 (115, 115*a*, 115*b*), the first heat sink 18 (118), and the second heat sink 19 (119). The semiconductor chip 16 accommodates the switching element 6, and the semiconductor chip 17 accommodates the switching element 7. The positive electrode conductive plate 13 (113) is joined to the high-potential terminal of the semiconductor chip 16 on one side. The negative electrode conductive plate 14 (114) is joined to the low-potential terminal of the semiconductor chip 17 on the other side. The mid-point conductive plate 15 (115, 115*a*, 115*b*) is connected to the low-potential terminal of the semiconductor chip 16 on one side and to the high-potential terminal of the semiconductor chip 17 on the other side. The first heat sink 18 (118) has electric conductivity, faces the positive electrode conductive plate 13 (113) and the negative electrode conductive plate 14 (114) with the isolating layer 31 (131) interposed therebetween, and is connected to the ground terminal 24 maintained at a ground potential. The second heat sink 19 (119) has electric conductivity, faces the mid-point conductive plate 15 (115, 115*a*, 115*b*) with the isolating layer 31 (the first isolating layers 131, or the second isolating layers 133) interposed therebetween, and is isolated from the ground terminal 24. In each of the power converters 2, 2*a*, 2*b*, 2*d* in FIG. 2, FIG. 3, FIG. 4, FIG. 6, the second heat sink 19 (119) is coupled to the first heat sink 18 (118) with the isolating member 32 (132) interposed therebetween.

In the drawings, only one set of series connection (series connection of the two switching elements) is shown, but the power converter may include multiple sets of series connections. In this case, the power converter may include multiple sets of semiconductor chips, each set including two semiconductor chips, each semiconductor chip accommodating the switching elements, and each set may include any of the structures shown in FIG. 2 to FIG. 6.

While the specific examples of the present disclosure have been described in detail above, these examples are merely illustrative and do not limit the scope of claims. The technique described in the claims includes the above-illustrated specific examples with various modifications and changes added thereto. The technical elements described in the present specification or the drawings exhibit technical utility independently or in various combinations, and are not limited to the combination described in the claims at the time of filing. The technique illustrated in the present specification or the drawings can achieve a plurality of objects at the same time, and has technical utility simply by achieving one of these objects.

What is claimed is:

1. A power converter comprising:
   two switching elements connected in series;
   a positive electrode conductive plate connected to a high-potential terminal of a series connection of the two switching elements;
   a negative electrode conductive plate connected to a low-potential terminal of the series connection of the two switching elements;
   a mid-point conductive plate connected to a middle point of the series connection of the two switching elements;
   a first heat sink having electric conductivity, the first heat sink facing the positive electrode conductive plate with a first isolating layer interposed between the first heat sink and the positive electrode conductive plate, the first heat sink facing the negative electrode conductive plate with the first isolating layer interposed between the first heat sink and the negative electrode conductive plate, and the first heat sink being connected to a ground terminal maintained at a ground potential; and
   a second heat sink having electric conductivity, the second heat sink facing the mid-point conductive plate with a second isolating layer interposed between the second heat sink and the mid-point conductive plate, the second heat sink being isolated from the ground terminal.

2. The power converter according to claim 1, wherein
   the first heat sink and the second heat sink are coupled to each other with an isolating member interposed between the first heat sink and the second heat sink.

3. The power converter according to claim 1, wherein
   a refrigerant flow passage is disposed between the first heat sink and the second heat sink.

4. The power converter according to claim 1, wherein
   the first heat sink is disposed so as to surround the two switching elements, the first isolating layer, the positive electrode conductive plate, the negative electrode conductive plate, the mid-point conductive plate, the second isolating layer, the second heat sink, and an isolating member; and
   the second heat sink faces the first heat sink with the isolating member interposed between the second heat sink and the first heat sink.

* * * * *